United States Patent [19]

Chapman

[11] 4,429,330
[45] Jan. 31, 1984

[54] INFRARED MATRIX USING TRANSFER GATES

[75] Inventor: Richard A. Chapman, Dallas, Tex.

[73] Assignee: Texas Instruments Incorporated, Dallas, Tex.

[21] Appl. No.: 141,498

[22] Filed: Apr. 18, 1980

[51] Int. Cl.³ .......................... H04N 5/33; H04N 3/15
[52] U.S. Cl. ...................................... 358/113; 357/24; 358/213
[58] Field of Search ................ 358/113, 213; 250/334, 250/211 J; 357/30, 24 LR

[56] References Cited

U.S. PATENT DOCUMENTS

| | | | |
|---|---|---|---|
| 3,626,193 | 12/1971 | Ishihara | 358/213 |
| 3,995,302 | 11/1976 | Amelio | 358/213 |
| 4,072,863 | 2/1978 | Roundy | 358/113 |
| 4,084,190 | 4/1978 | Stein | 358/213 |
| 4,134,031 | 1/1979 | Weimer | 357/24 LR |
| 4,142,207 | 2/1979 | McCormick et al. | 358/113 |
| 4,200,892 | 4/1980 | Weimer | 358/213 |
| 4,322,638 | 3/1982 | Lee et al. | 357/24 LR |

OTHER PUBLICATIONS

Weimer–Self Scanned Image Sensory Based on Charge Transfer by the Bucket Brigade Method–IEEE Trans Electron Devices, vol. Ed. 18, No. 11, Nov. 1971, pp. 996–1003.

Primary Examiner—Joseph A. Orsino, Jr.
Attorney, Agent, or Firm—Alva H. Bandy; N. Rhys Merrett; Melvin Sharp

[57] ABSTRACT

An infrared random access imager system is disclosed which includes a scanning mechanism, a random access imager detector matrix, and a video signal processor. The scanning mechanism scans the infrared energy emanating from a scene in the field-of-view. The random access imager detector matrix stores charges as charge packets representative of the infrared energy impinging thereon and the video signal processor processes the charge packets into video signals. Each random access imager detector matrix element comprises a modified charge injection device, which has two electrodes per unit cell, and horizontal and vertical metal-lead address lines, to which is added a third electrode. The third electrode is a transfer gate which transfers the charge of the detector element into a read line and keeps the charge from one detector from spilling into the detector well of an adjoining unit cell. Thus, charge carriers are created by photoabsorption and collected in the detector well (storage well). Upon activation of a charge transfer electrode the charge passes over the dc transfer gate (word line) and down a read line (bit line) to an output charge collector means for processing by the signal processor.

10 Claims, 17 Drawing Figures

INFRARED MATRIX USING TRANSFER GATES

This invention relates to infrared imaging systems and more particularly to an infrared imaging system having an infrared detector matrix utilizing transfer gates.

In the past, infrared detector systems have been of two types staring and non-staring. Staring systems do not require a scanning assembly; while non-staring systems have scanning assemblies. Further, prior art infrared detector systems were transducer type; that is, the impinging infrared energy generated a charge which could be collected and integrated over several frames. The integrated signals were preamplified to provide working signals for video processing. The system is relatively expensive, bulky in size, and inefficient in performance.

Accordingly it is an object of this invention to provide an infrared energy imaging system which leads itself to mass production techniques, is relatively small in size, and has substantially increased efficiency.

Another object of the invention is to provide an infrared energy imaging system with substantially reduced blooming and crosstalk.

Still another object of the invention is to increase the charge packet capacity to enable longer integration periods.

Briefly stated the infrared imaging system comprises an optical assembly, a scanning assembly, an infrared detector matrix, and a video signal processor. If the system is a staring system, the scanning assembly is omitted. The optical assembly focuses infrared energy emanating from a scene in its field of view along an optical path where it is scanned by the scanning assembly and the scanned infrared energy impinged onto the infrared detector matrix. The infrared detector matrix is a random access imager (RAI) which converts the impinging infrared energy to representative charge packets which are processed into video signals by the video signal processor.

The novel features characteristic of this invention are set forth in the appended claims. The invention itself, however, as well as other objects and advantages thereof may best be understood by reference to the following detailed description of illustrative embodiments when read in conjunction with the accompanying drawings in which:

FIG. 3a is a cross-sectional view taken along line A—A of FIG. 2a;

FIG. 4 is a cross-sectional view taken along line B—B of FIG. 2a;

FIG. 6 is a cross-sectional view taken input along line B—B of FIG. 5 to show the second embodiment of the read out structure extended to show the read line of B—B FIG. 2a;

Figure 1:
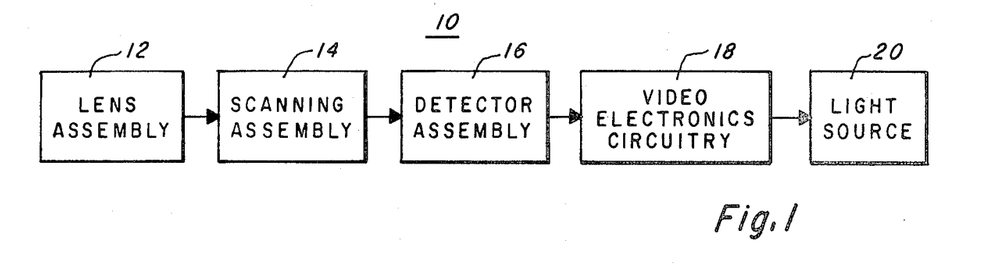
FIG. 1 is a block diagram of a forward looking infrared system.

Referring now to the drawings, the forward looking infrared (FLIR) imager 10 (FIG. 1) comprises a lens assembly 12, scanning assembly 14, detector assembly 16, video electronic circuitry 18, and a display 20. In a staring system, the scanning assembly 14 is omitted. The lens system 12 is comprised of three lens elements, not shown, which for operation in the infrared region are germanium elements. These elements collect infrared energy emanating from a scene and focus this energy onto a rotating mirror, not shown, of the scanning assembly 14. The rotating mirror may be, for example, a two sided flat mirror. The first side or front surface, of the mirror is used to receive the infrared energy, and the second side, or rear surface, is used to scan the modulated visible light from the light source 20. The scanning mirror is positioned with its "Y" axis normal to the optical axis and its "X" axis at a 45 degree angle thereto. In this position, the scanning mirror reflects the infrared energy to a folding mirror, not shown, for reflections onto the detector matrix of the detector assembly 16. The video electronics circuitry 18 connects each output of the detector array to a light emitting diode, for example, of the light source 20, and provides the signal processing auxillary functions to modulate the output of each light emitting diode. Finally, the visible light from the light source is directed to impinge upon a folding mirror, not shown, and the folding mirror reflects the visible light through a collimating lens to the second side, or back surface, of the scanning mirror for viewing by an observer. It will be appreciated that the output of the detector matrix might be processed by the video electronics circuitry into a TV format for display on a cathode ray tube. Those desiring details of suitable structures for these assemblies, except the detector matrix to be described hereinafter, are referred to U.S. Pat. No. 3,912,927 issued Oct. 14, 1975, to Richard G. Hoffman, II, for an "Opto-Mechanical Device For Phase Shift Compensation of Oscillating Mirror Scanners."

Figure 2A:
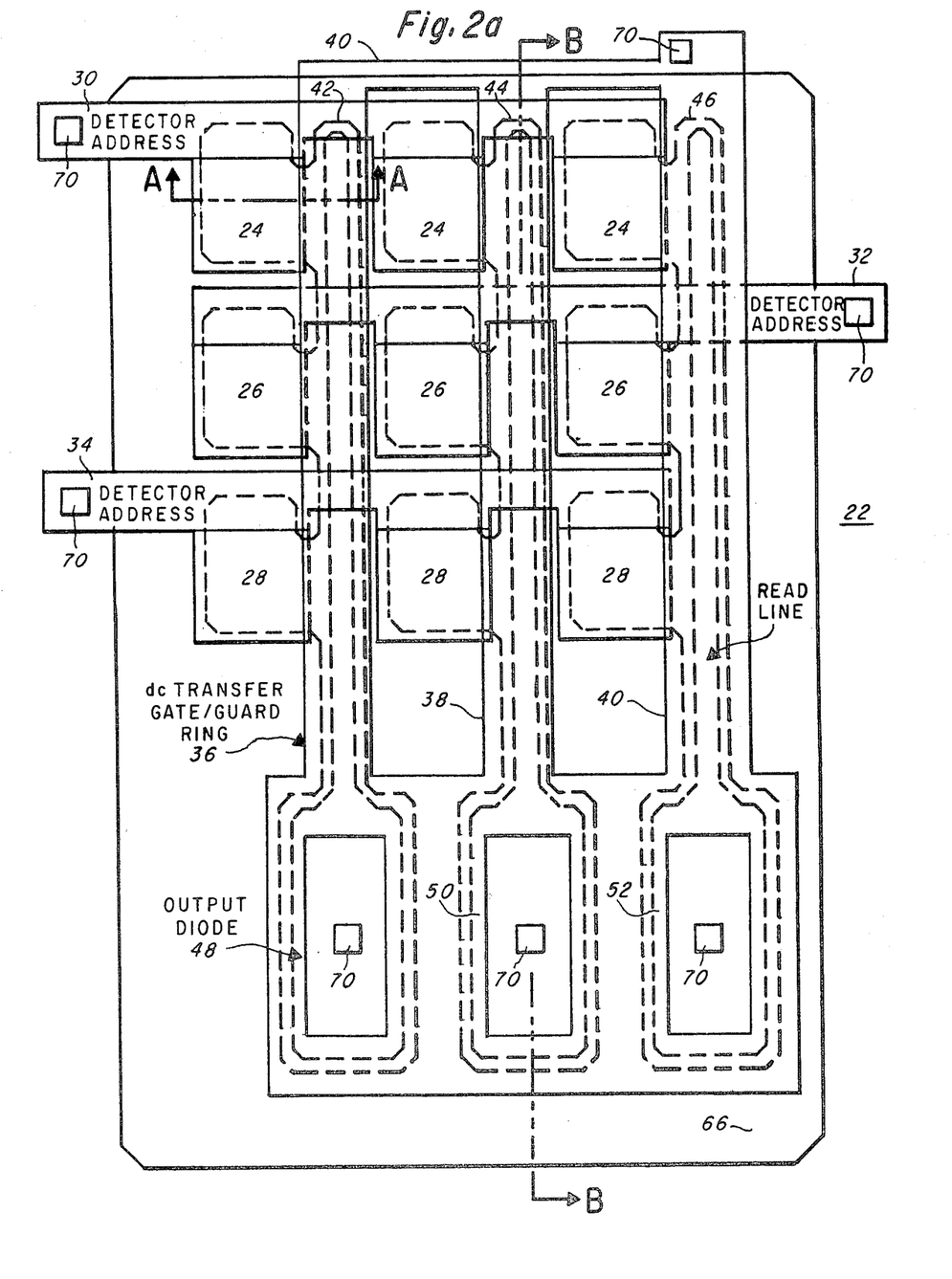
FIG. 2a is a plan view of the random access imager (RAI)

Referring now to FIG. 2a, the random access imager (RAI) 22 comprises a 3×3 detector matrix. A 3×3 detector matrix is disclosed for description purposes only; a 64×64 element matrix array is, for example, a more practical design. The detector elements are arranged in rows and columns; the rows of elements being designated, respectively, 24, 26, and 28. Each row of detector elements 24, 26, and 28, are addressed, respectively, through detector address busses 30, 32, and 34. The columns of detector elements 24, 26 and 28 are connected by transfer gates 36, 38, and 40, respectively, to read lines 42, 44, and 46. The read lines 42, 44, and 46 are connected, respectively, to the output collectors 48, 50, and 52.

Figure 2B:
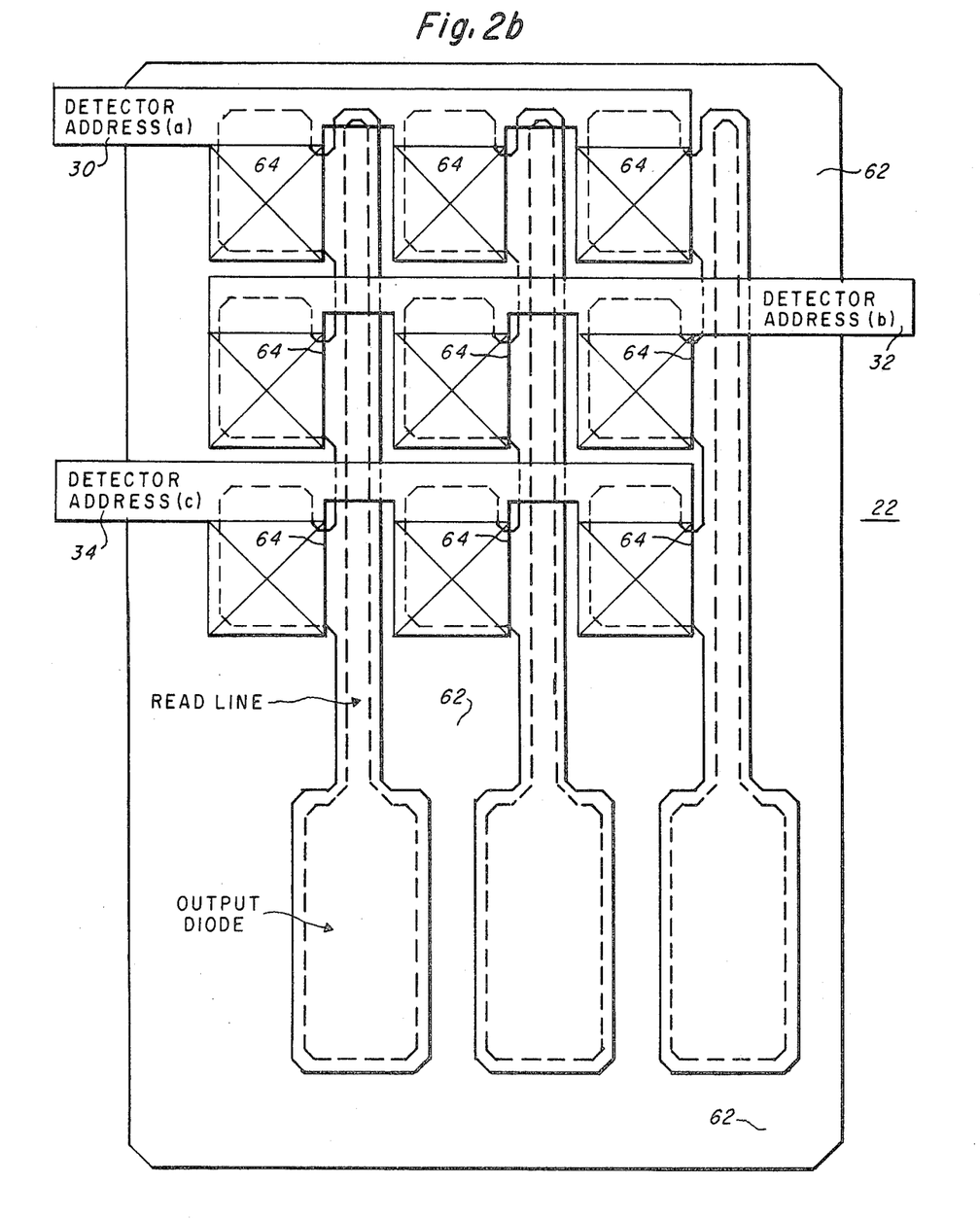
FIG. 2b is a partial plan view of the RAI of FIG. 2a with the transfer gate/guard ring metalization removed to show more clearly the detector elements metalization and connecting buses.
Figure 2C:
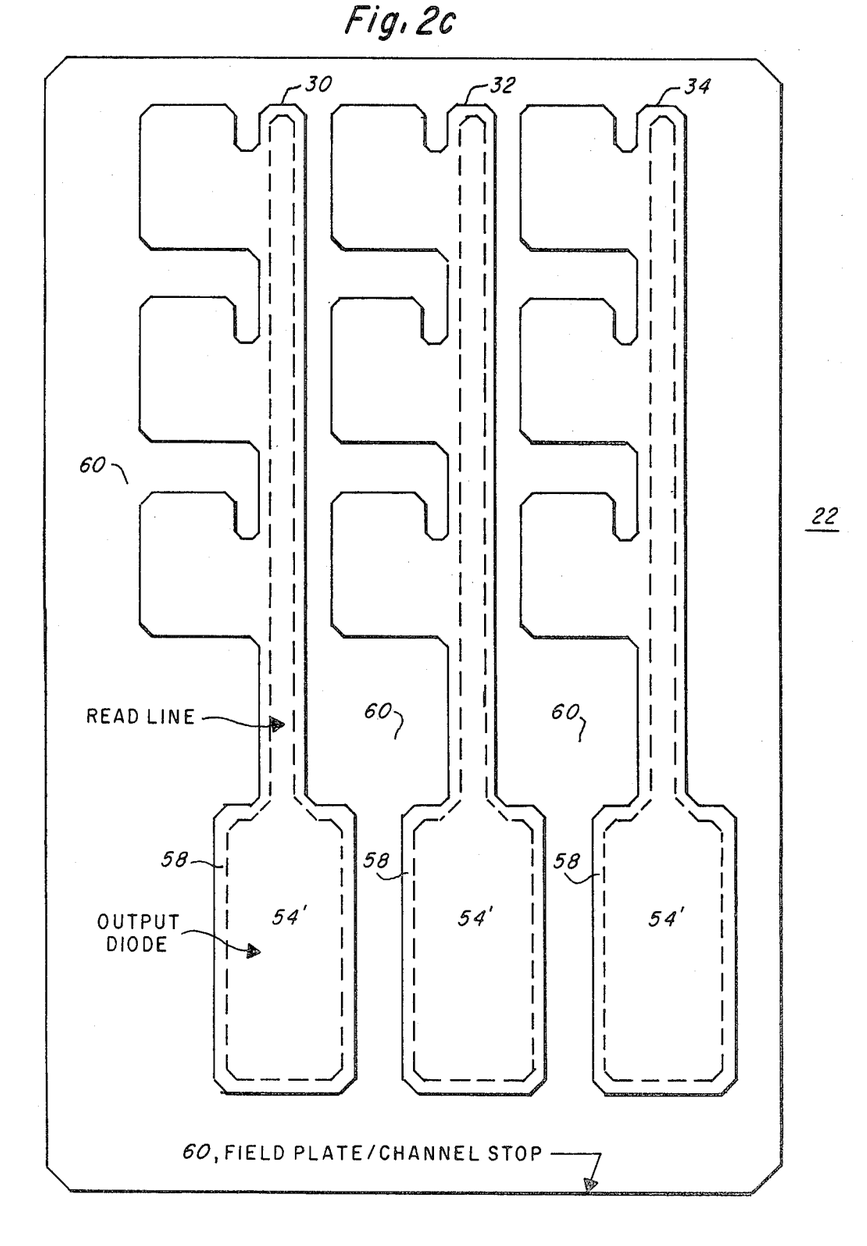
FIG. 2c is a partial plan view of the RAI of FIG. 2b with detector elements metalization and connecting buses removed to show more clearly the field plate/channel stop metalization over the insulator, semiconductor substrate.
Figure 3A:
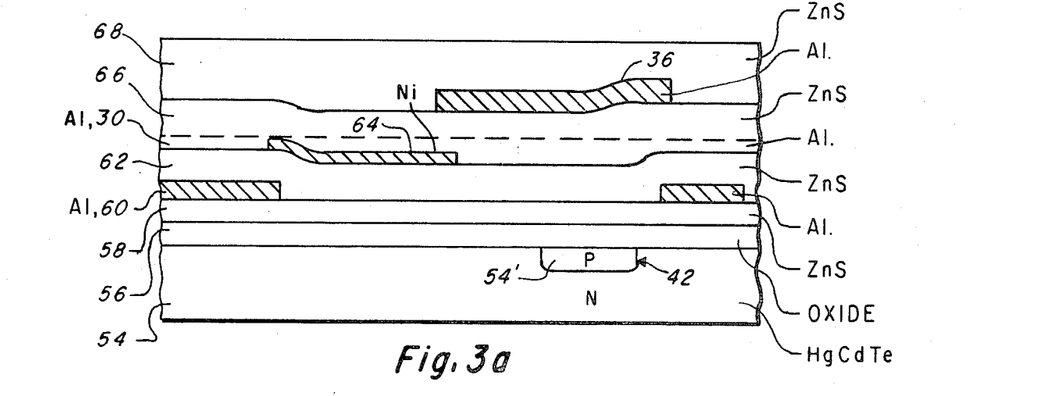

Refer now to FIG. 3a which is a cross section of one detector and adjoining read line taken along line A—A of FIG. 2a. In the first embodiment of the RAI 22 (FIG. 2a) the rows of detector elements 24, 26 and 28 and transfer gates 36, 38 and 40 are metal/insulator/semiconductor (MIS) structures and the read lines 42, 44, 46, and output collectors 48, 50 and 52 are p-n junctions. In this embodiment, either a p-type or n-type conductivity semiconductor material may be used for a substrate 54 (FIG. 3a). The particular material used depends on the infrared wavelength to be detected. For example, silicon may be used for the visible 1.1 micron wavelength and mercury/cadmium/telluride may be used for either the 3-5 micron wavelength or 8-14 micron wavelength bands. The bandgap of the material is the determining factor. As shown in FIGS. 3a and 2c, the substrate 54 is of n-type HgCdTe. The p-n junction read line 42 is formed, for example, by forming a native oxide layer 56 of a thickness between 500 Å-700 Å on the HgCdTe substrate 54. The oxide is formed by anodization. The oxide layer 56 is patterned and a via (aperture) etched therein using a lactic acid. The junction is then formed by ion implantation, or impurity diffusion, or mercury in-or-out diffusion to form the p-type conductivity region 54'. The oxide may be left on after junction formation or stripped off, reoxidized, and the via recut using previously etched alignment marks in the substrate. A thin metal layer, not shown, can be deposited directly on the via to the junction before proceeding with the MIS electrode fabrication. The metal layer forms a via etch stop in the final via etch through a ZnS insulation layer.

After the p-n junction is formed, a 500 Å to 1500 Å thick layer 58 of insulating material, such as, for example, ZnS is thermally evaporated on top of the native oxide layer 56. The ZnS layer 58 is then masked and the field plate/channel stop MIS electrode 60 which is, for example, a thick (200 Å-1500 Å) aluminum or nickel electrode patterned on the ZnS layer 58. The electrode 60 is preferably formed using the photolithographic lift process. The device as described to this point is shown in FIG. 2c.

The channel stop MIS structure formed by the substrate 54, insulation layer 58 and channel stop electrode (first level electrode) 60 is covered by a second insulating layer 62 of a thickness between 300 Å-500 Å (FIG. 3a). The layer 62 is preferably ZnS. The second insulating layer 62 is then firstmetallized, using the photolithographic lift process or a chemical etch to form the thin (150Å) semitransparent electrode 64 for each of the rows of detector elements 24, 26, and 28 (FIG. 2b). The thin electrodes are preferably nickel electrodes. The second insulating layer 62 is then metalized again (FIG. 3a) using the photolithographic process to form the thick (200 Å-2000 Å) opaque metal (aluminum) address lines 30, 32, and 34 (FIG. 2b). The aluminum address lines 30, 32, and 34 overlap the thin nickel electrodes 64 to electrically connect the rows of detector elements 24, 26, and 28 (FIG. 2b) to the address lines 30, 32 and 34.

Next, a third layer 66 (FIG. 3a) of insulating material (ZnS) is deposited to a thickness between 1000 Å to 3000 Å over the metalizations, and then the opaque transfer gate 36, is formed using the photolithographic lift process, to provide the thick (1000 Å-5000 Å) aluminum electrodes 36, 38, and 40 (FIG. 2c). Finally, an additional layer 68 (FIG. 3a) (1000 Å-5000 Å) of insulating material (ZnS) is deposited and vias 70 (FIG. 2a) etched to all electrodes and to substrate. A soft bonding material such as, for example, indium is used to form bonding pads and expanded contacts touch the desired electrodes through the vias. In a p-n junction read line, a connection is not required to the read line; as it is reset much as a floating source for a MOSFET is reset.

Figure 3B:
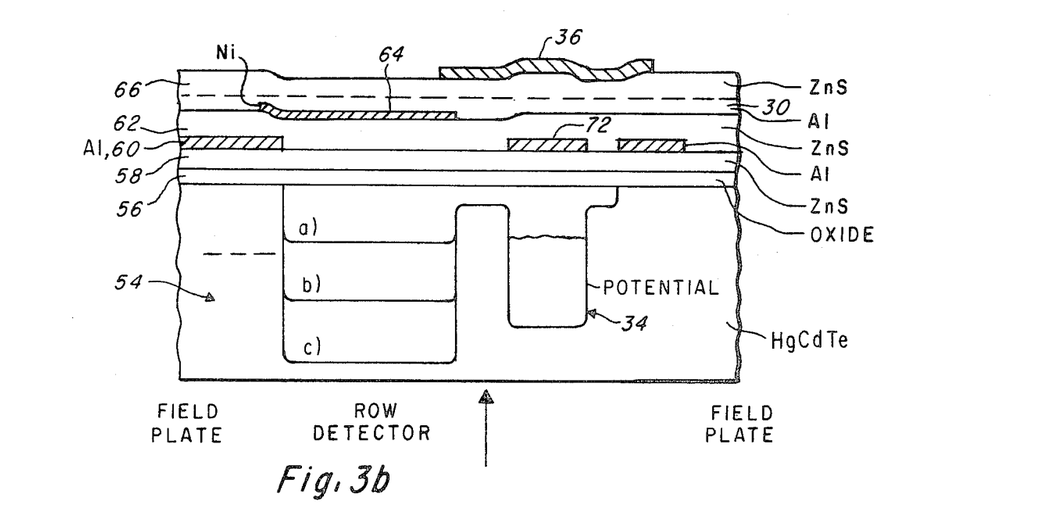
FIG. 3b is a cross-sectional view taken along line A—A of FIG. 2a modified to show another embodiment of the read out line.

In a second embodiment (FIG. 3b), which is a cross-section taken along line A—A of FIG. 2a, the random access imager is a metal-insulator-semiconductor (MIS) structure throughout. That is, the read lines 42, 44, and 46 and output collectors 48, 50, and 52 are MIS structures. The structure is identical to that of FIG. 3a except in the MIS embodiment the n-type HgCdTe substrate 54 is anodized to form the native oxide layer 56. An insulation layer 58 of ZnS is formed over the native oxide layer 56, and the field plate/channel stop 60 and read line electrode 72 of read lines 42, 44 and 46 (FIG. 2a) are formed on the ZnS layer 58 (FIG. 3b). The electrode 72 replaces the p-n junction read line of FIG. 3a. To complete the structure, the second ZnS insulating layer 62 covers the field plate/channel stop 60 and read line electrode 72 supported by the first ZnS layer 62. The detector element thin electrode 64 and bus 30 are formed on the second ZnS insulating layer and covered by the third ZnS layer 66. The third electrode or dc transfer gate 36 is formed on the third ZnS insulating layer 66. The transfer gate 36 provides the guard ring separating the detector element from the read line.

Figure 4:
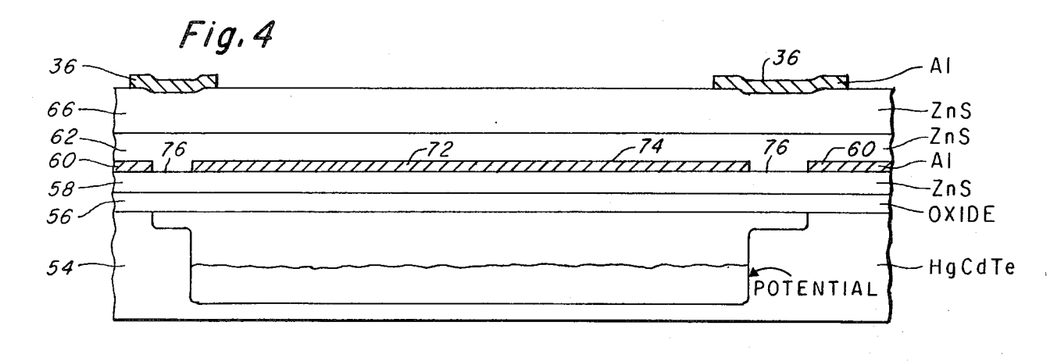

The MIS structure is also shown in FIG. 4, which is a cross section taken along line B—B, FIG. 2a. In this structure, the HgCdTe substrate 54 supports the native oxide layer 56 and ZnS insulation layer 58. The field plate/channel stop electrode 60 and read line electrode 72 which is contiguous with output collector electrode 74 are metalized on the insulator layer 58 and form the first electrode area. The first level metalization is covered by insulation (ZnS) layers 62 and 66; layer 66 supports the transfer gate 36. The transfer gate electrode 36 covers the space 76 around the read line and output collector to serve also as a guard ring electrode.

Figure 5:
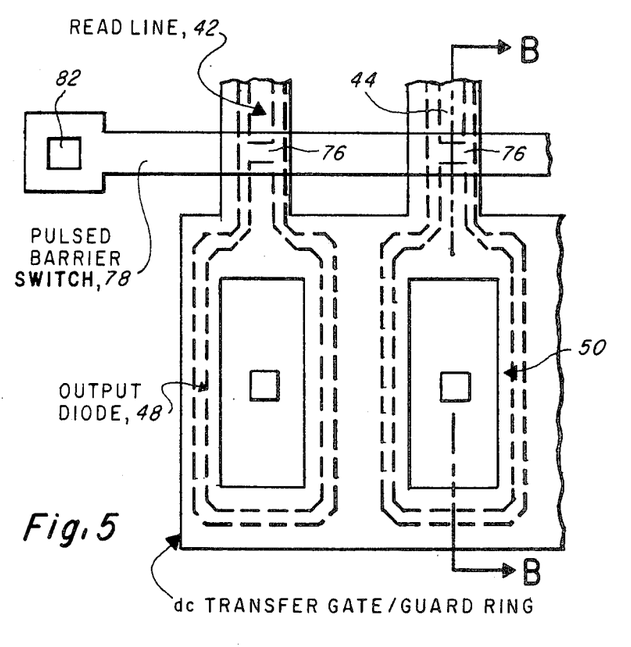
FIG. 5 is a partial top view of the random access imager showing a second embodiment of the read out line and output diode.

The contiguous read lines 42, 44, and 46 and output collectors 48, 50, and 52 (FIG. 2a), in another embodiment (FIG. 5), are formed in a spaced relationship by gaps 76 and a pulsed barrier switch 78 utilized to control charge flow through the gaps. This embodiment (FIG. 6), which is an MIS structure, includes the HgCdTe 54 substrate supporting the native oxide layer 56 and ZnS insulating layer 58, and the first level metalization formed on the insulation layer 58. The first level metalization includes the field plate/channel stop 60, read line electrode 72 and output collector electrode 74. The read line electrode 72 and output collector electrode 74 are spaced apart to form the gap 76. The first level electrodes are covered by the ZnS insulator layer 62, and the barrier diode electrode 80 is formed on the ZnS layer 62 over the gap 76. The ZnS insulator layer 66 covers the barrier diode electrode 80 and the transfer gate 36 is formed on the ZnS insulator layer 66. A via 82 (FIG. 5) is etched through the ZnS layer 66 and an indium contact formed therein for electrical connection.

The use of the pulsed barrier switch 78 makes possible a p-n junction read line and MIS output diode, or an MIS read line and p-n junction output diode.

The random access imager (RAI) may be operated in a non-ramped mode or in a ramped mode. In the non-ramped mode, the RAI (FIG. 7a) includes a horizontal scan generator 84, the detector matrix 22, reset and buffer field effect transistor circuits 86, preamplifier 88 and clamp-sample-and-hold circuits 90. For ramped operation, a ramp waveform generator 92 (FIG. 7b) is included between the horizontal scan generator 84 and the RAI 22; otherwise the two structures are the same.

Figure 7A:
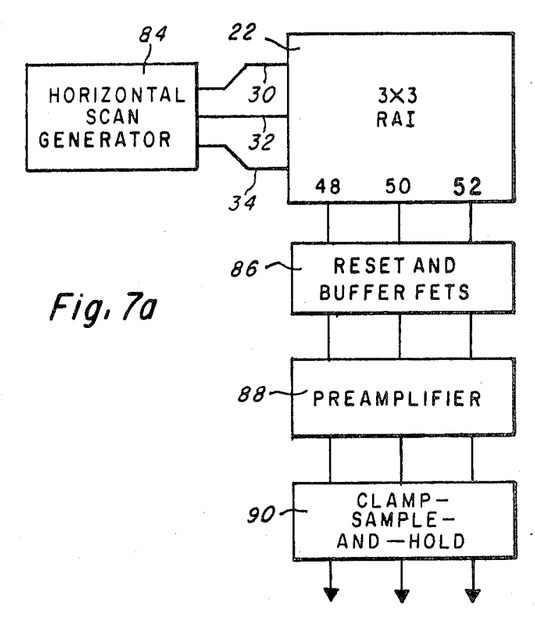
FIGS. 7a and 7b are block diagrams of the circuitry necessary for an RAI array without ramping and with ramping, respectively.
Figure 7B:
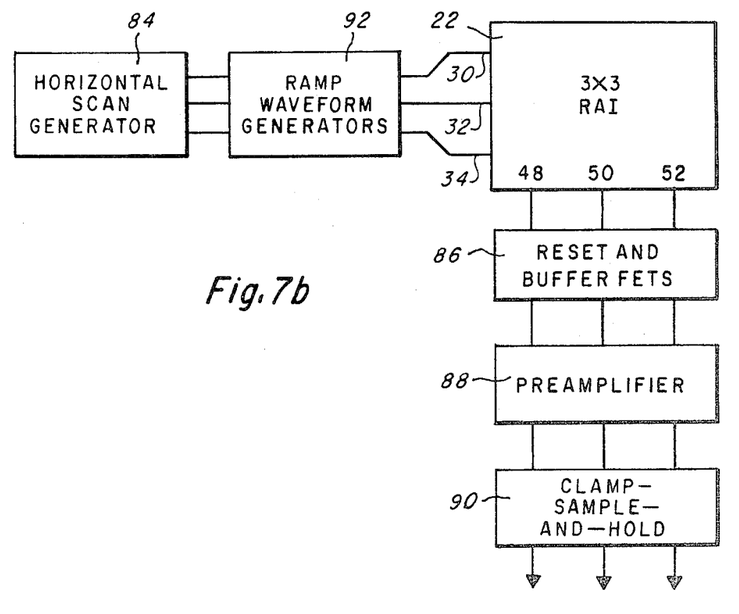

In the non-ramped structure the horizontal scan generator 84, which is, for example, a ring counter, supplies the waveforms, hereinafter described, to the detector address lines 30, 32, and 34. The read lines 42, 44 and 46 and their corresponding output collectors 48, 50 and 52 (FIG. 2a) are each connected to reset and buffer FET circuits 86 (FIG. 7a). Reset and buffer FET circuits are also connected to the preamplifiers 88. The preamplifiers 88 have their outputs connected to clamp-sample-and-hold circuits 90.

In the ramped mode (FIG. 7b), each output of the horizontal scan converter 84 activates a ramp waveform generator 92. The waveform generator is, for example, an RC charging circuit followed by an operational amplifier; in this form, the linear portion of the RC rise time is used. In another embodiment, the ramp generator can approximate a linear ramp by providing a series of closely spaced step increases in voltage.

The RAI output circuitry (FIG. 8) used to sense the charge on each output collector is identical for each column of elements. Thus, only one circuit need be described; the circuit includes either the p-n junction output diode 48 whose anode is connected to source 94 of reset MOSFET 96 or the MIS structure whose electrode is connected to source 94 of reset MOSFET 96. MOSFET 96 has its drain 98 connected to a reference voltage and its gate 100 connected to a preset pulse. When a preset pulse is received, the negative reference voltage is applied to the anode of the p-n junction output diode 48 and gate 102 of buffer MOSFET 104. Buffer MOSFET 104 has its source 108 connecterd to a negative $V_{ss}$ voltage and its drain 110 connected to load resistor 112 connected to a positive $V_{DD}$ source and base 114 of bipolar transistor 116. Transistor 116 has its collector 118 connected to the negative $V_{SS}$ voltage and its emitter output 120 connected to load resistor 122 connected to the $V_{DD}$ source, and to the input of the clamp-sample-and-hold circuit 90.

Figure 8:
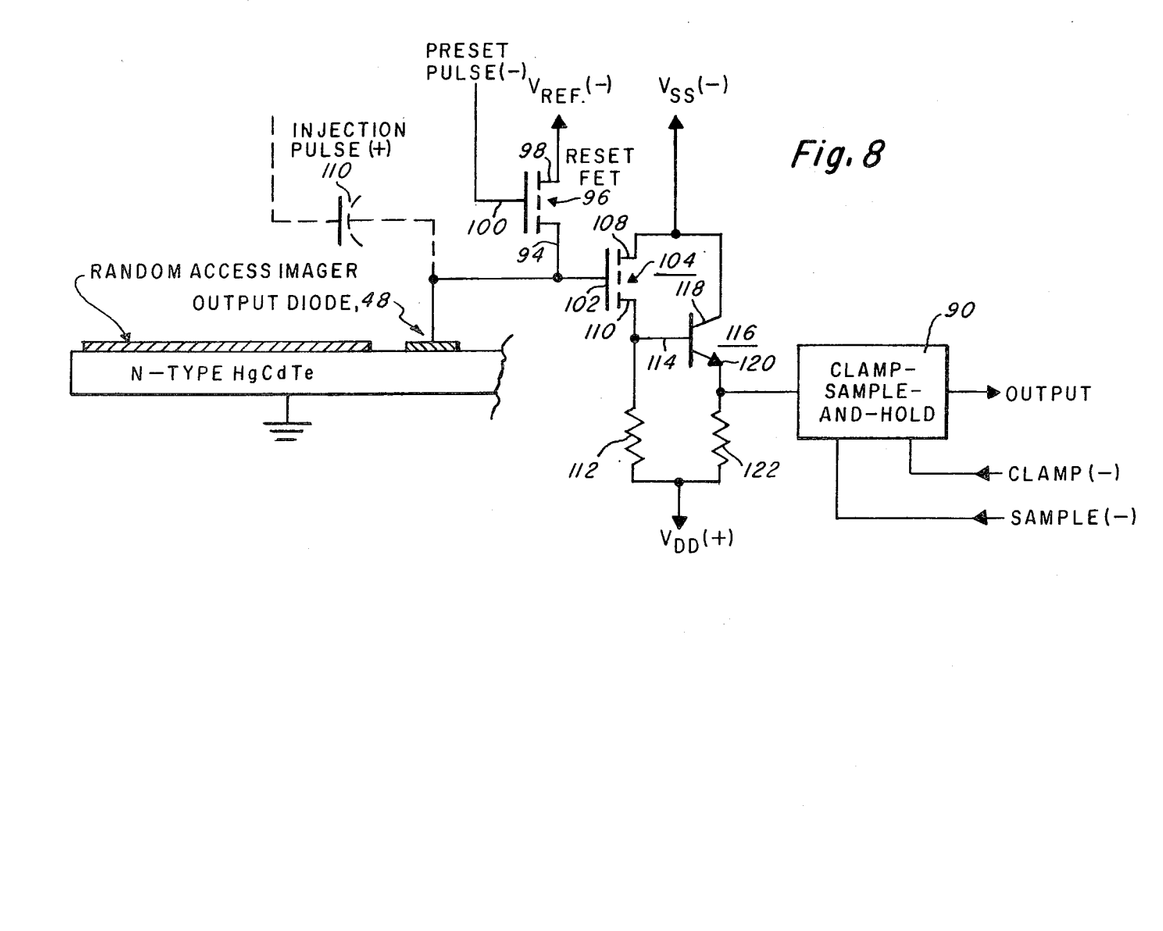
FIG. 8 shows the output circuitry for each output diode of the RAI array.

In the embodiment where the output collector is an MIS structure, an injection pulse capacitor 110, shown in dotted line in FIG. 8, is provided.

The reset and buffer MOSFETS can be in a separate silicon chip adjoining the detector RAI chip or alternatively, the reset and buffer MOSFETS can be built directly on the same chip as the RAI; in this monolithic version using the output diode 48, this diode can be the source of the reset MOSFET.

Figure 9A:
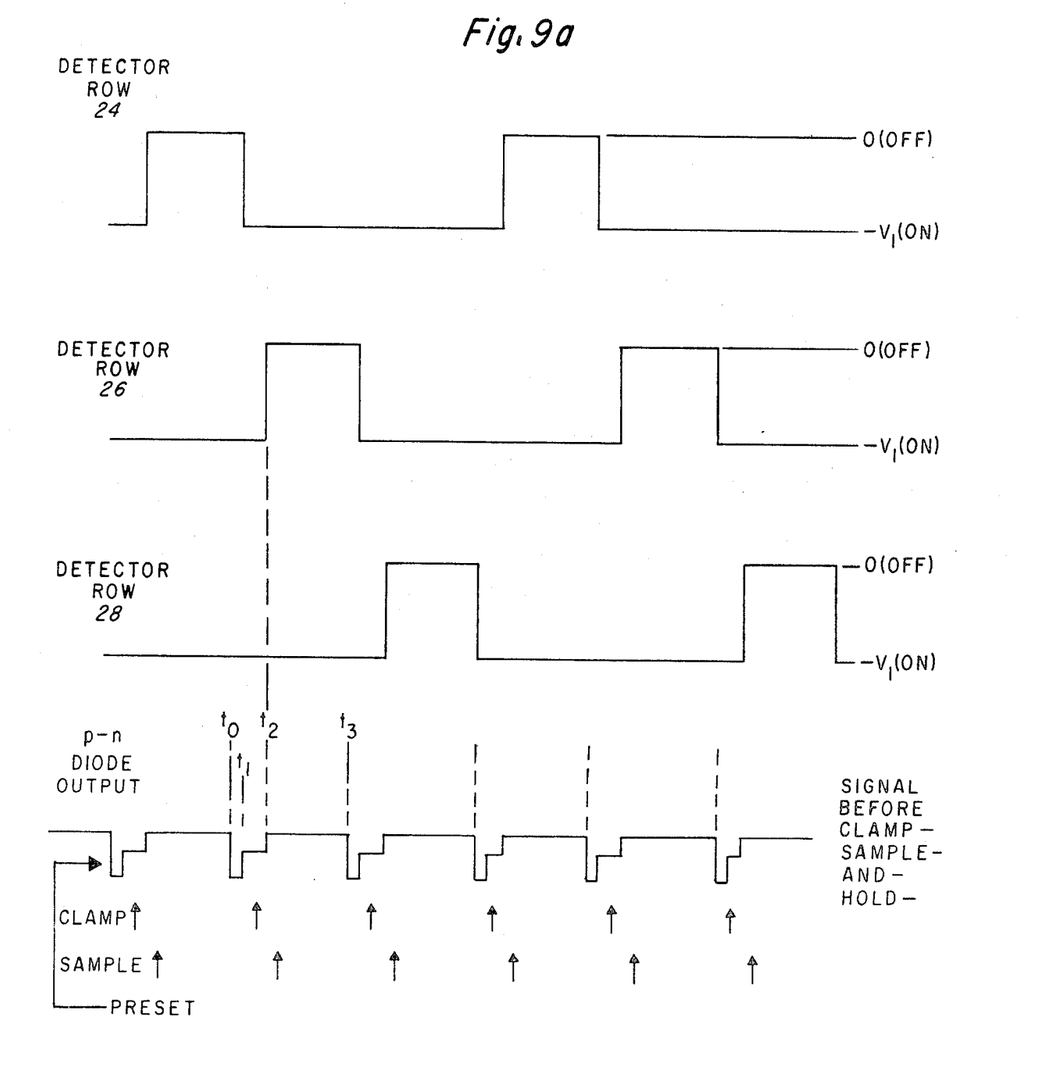
FIGS. 9a, 9b, and 9c show, respectively, the timing and address waveforms for the diode and MIS charge collector means without ramping; and MIS charge collector means with ramping.
Figure 9B:
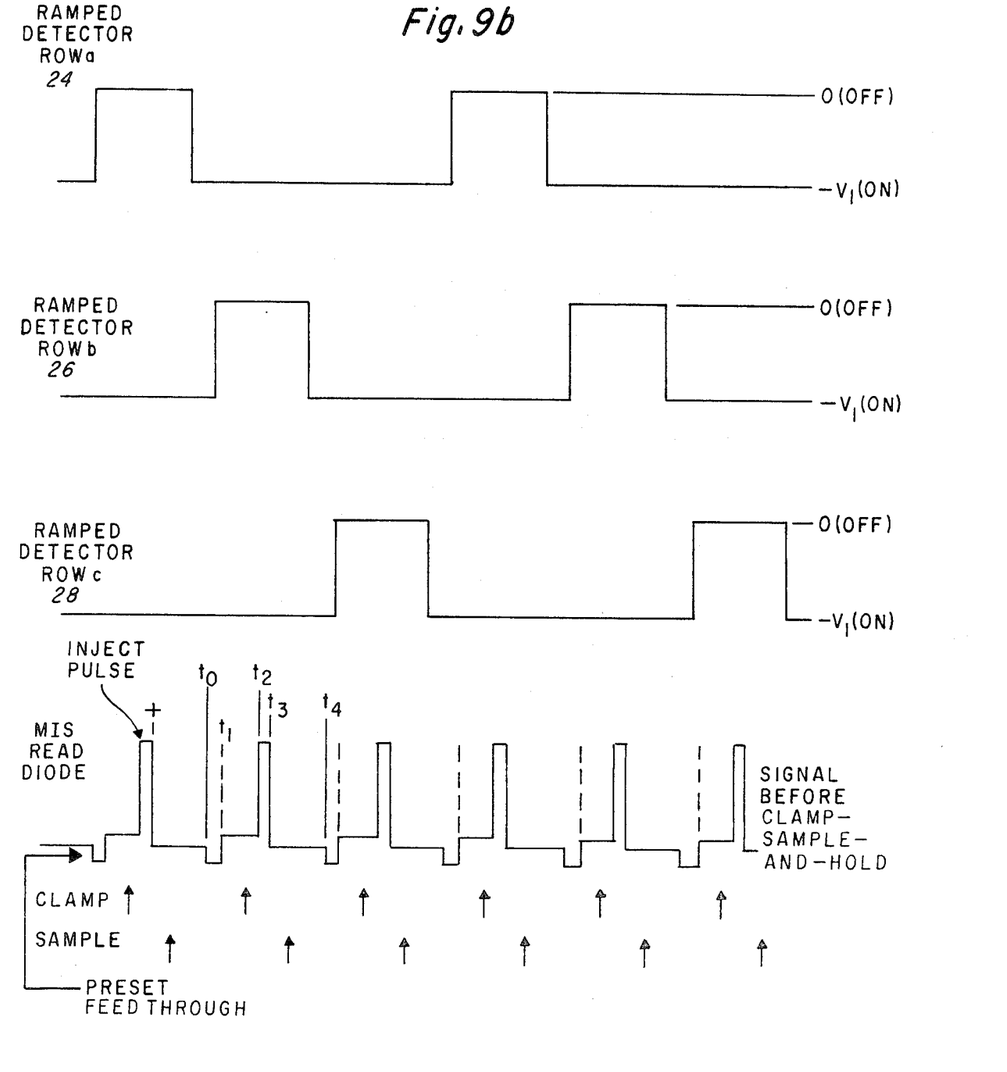
Figure 9C:
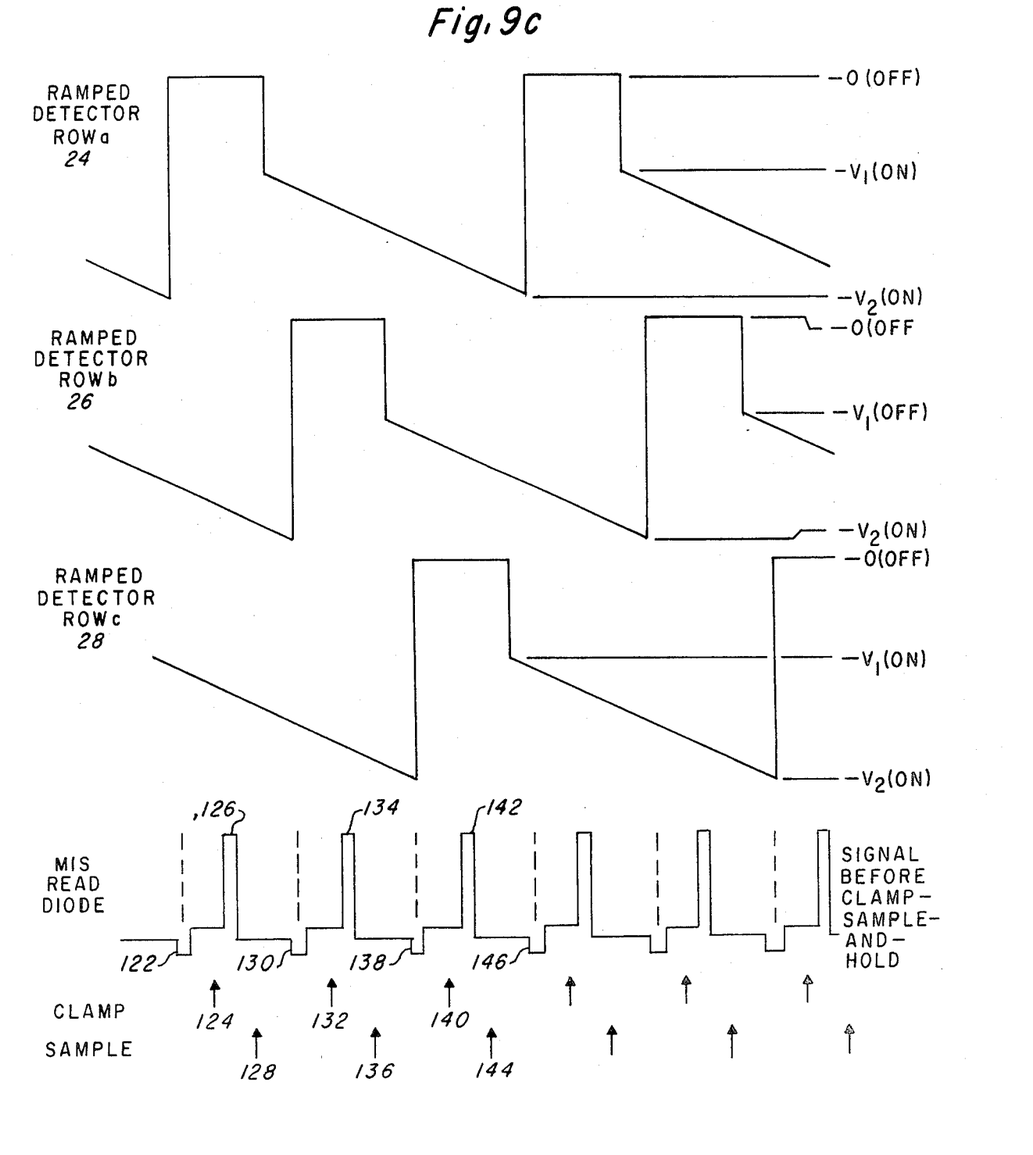

FIGS. 9a, 9b, and 9c show the voltages applied to the detector rows 24, 26, and 28 for the case using n-type material with zero volts being "off" and $-V_1$ or $-V_2$ "on" and thereby creating a potential well under the row electrodes 24, 26, and 28. As row wells 24 turn off, row wells 26 turn on, and so forth. The turn-off of row 24 and the turn-on of row 26 can be simultaneous or 24 may turn-off slightly before 26 turn on, and so forth. The waveforms at the bottom of FIGS. 9a, 9b, and 9c show the voltage output at 48, 50, and 52. The arrows show the timing of the clamp and sample pulses.

Refer now to FIG. 9a for a description of the operation of the device when p-n junction type (diode) collectors 48, 50, and 52 are used.

With row of detector elements 24 off and having already dumped their charges into the collector diodes 48, 50 or 52 (FIG. 2a) and rows of detector elements 26 and 28 on and charging, a negative preset voltage pulse is applied during time $t_0 - t_1$ to the charge collecting diodes 48, 50, and 52. The reset pulse sets the diode to a fixed known voltage prior to dumping charge onto the diode from row 26 detectors. Next, during the time $t_1-t_2$ the reset pulse is turned off and the voltage on the diodes 48, 50, and 52 are measured and amplified by buffer 104 (FIG. 8) and clamped by CS&H circuit 90. At the time $t_2$ the row of detector elements 26 is turned off and the charges of their potential wells dumped during time $t_2-t_3$ through read lines 42, 44, and 46 (FIG. 2a) into the collector diodes 48, 50 and 52. The collector diodes 48, 50 and 52 voltage outputs are buffered and sampled by CS&H circuit 90 (FIG. 8). The clamped voltage is subtracted from the sampled voltage and the difference represents the intensity of the infrared photon flux impinging on the second row of detector elements 26. At $t_3$ (which is also $t_0$) the second cycle begins with the second row of detector elements being turned on by the second reset pulse for charging. At the end of the second cycle ($t_3$), the charges of the third row of detector elements 28 have been determined, and the row of detector elements 28 turned on again. Then the third cycle begins with the row of detector elements 24 being turned off, and at the end of the third cycle the charges of the first row of detector elements 24 have been determined and the first row of detector elements 24 turned on again. The cycle continues throughout the RAI operation. Although the selection of rows has been shown in a sequential operation, the rows may be selected randomly.

For operation of the MIS embodiment of the RAI, the timing and waveforms are shown in FIG. 9b. With the row of detector elements 24 off and the rows of detector elements 26 and 28 both charging at $t_0$, a reset pulse is applied to the MIS output elements 48, 50, and 52 to set the potential wells underneath these MIS electrodes to a fixed constant surface potential. At $t_1$, the reset pulse is turned off. Between the $t_0$ and $t_1$, the second row of detector elements 26 are turned off and their charges are dumped into the read lines 42, 44, and 46. During the time $t_1-t_2$, the voltages of the MIS output electrodes 48, 50, and 52 are measured and clamped by the buffer and CS&H circuit (FIG. 8). At the time $t_2-t_3$ (FIG. 9b) an injection pulse is applied to the barrier gate 78; barrier gate 78 is turned off slightly prior to $t_2$ and turned on slightly after $t_3$. Because the barrier gate is off during the time of the application of the injection pulse, the charges underneath the MIS output electrodes are injected into the substrate rather than back into the read lines 42 and 44 of FIG. 5. Next, during the time $t_3-t_4$ the charge collectors 48, 50, and 52 are sampled by the CS&H circuit 90 (FIG. 8) and the difference in the clamped and sampled voltages determined. This difference voltage represents the intensity of the infrared photon flux impinging on the rows of detector elements 26. At $t_4$ or $t_0$ of a cycle, a second reset pulse is applied to determine the charges of the third row of detector elements 28. Finally, the cycle is repeated for a third cycle to determine the charges of the first row of detector elements 24. The cycle is continued throughout RAI operation. The clamp and sample pulses in FIG. 9b are shown centered around the injection pulse and thereby detecting the charge injected into the substrate; in an alternate scheme, the preset pulse can be applied and turned off prior to the turn off of detector row 26 and the clamp and sample pulses centered around the turn off of detector row 26 thereby detecting the charge transferred underneath the output MIS electrodes 48, 50, and 52.

When the rows of detectors 24, 26, and 28 are ramped, multiple amplitude voltages are applied as shown in FIG. 9c. The potential wells are formed by biasing the metal gates 62 (FIG. 3b) of the rows of MIS elements 24, 26 and 28 (FIG. 2a) to a voltage to drive away the majority carriers from the surface of the semiconductor to uncover net impurity charge density $Q_D$ in a depletion layer and to permit the collection of mobile carrier charge $Q_{INV}$ in the potential well with surface potential $\psi_S$. The relationship between $\psi_S$ V, Q and the insulator capacitance per unit area is:

$$-(V-\psi_S)=Q/C_{INS}=Q_{INV}/C_{INS}+Q_D/C_{INS} \quad (1)$$

The thickness of the layer containing $Q_{INV}$ (less than $10^{-6}$ cm) when compared to the thickness of the layer containing $Q_D$ (greater than $10^{-4}$ cm) can be omitted and, $Q_D$ is written in terms of $\psi_S$ using $V_0=(gN\xi_0\epsilon)/C^2_{INS}$ where g is the electronic charge, N the net impurity concentration in the semiconductor, $\xi_0$ is the dielectric permittivity of free space, and $\epsilon$ is the dielectric constant of the semiconductor. The result for a p-type semiconductor with positive V and $\psi_S$ and with negative $Q_{INV}$ is:

$$-V+\psi_S \approx Q_{INV}/C_{INS}-\sqrt{2V_0\psi_S} \quad (2)$$

$$\sqrt{\psi_S}=-\sqrt{V_0/2}+\sqrt{V_0/2+V+Q_{INV}/C_{INS}} \quad (3)$$

The electric field $E_S$ at the surface of the semiconductor is:

$$E_S=\sqrt{2\psi_S gN/(\xi_0\epsilon)}$$

The charge stored in the well is related to $\psi_S$ or $E_S$ through equation (2). Thus, $$Q_{INV}=-C_{INS}(V-\psi_S-\sqrt{2V_0\psi_S}) \quad (4)$$

In the case of a full well:

$$Q_{FW}=C_{INS}(V-V_T) \text{ where} \quad (5)$$

$V_T$=the threshold for inversion.

In the usual mode of operation of a CTD, the gate voltages are pulsed between a maximum and a minimum gate voltage. In this mode, the MIS gate voltage V which gives the maximum empty well depth $\psi_S$ (or electric field $E_S$) in turn determines the maximum amount of charge $Q_{FW}$ which the well can contain. The maximum $E_S$ may be set by electric breakdown in the semiconductor. If the maximum $E_S$ in the semiconductor is very large, the maximum gate voltage may be set by electric breakdown in the insulator. In the case of silicon MIS devices, the maximum $E_S$ is in the range of $10^6$ V/cm and the maximum $\psi_S$, V, and $Q_{FW}$ are set by electric breakdown in the insulator. The maximum permissible electric field in the semiconductor is much smaller in narrow band gap semiconductors such as InSb and InAs and the alloy semiconductors HgCdTe, InAsSb, GaInSb, and PbSnTe. In the case of HgCdTe, the maximum $E_S$ is $10^4$ V/cm for an alloy composition to give an infrared response with long wavelength response threshold at 10 $\mu$m and is $3\times10^4$ V/cm for an alloy composition to give a response threshold at 5 $\mu$m. This wavelength threshold may be set by tunnel current $I_T$ breakdown which is related to $E_S$ and the bandgap $E_G$ of the semiconductor $$I_T=(AE_S^4/E_G^2)\exp(-B E^2_G/E_S) \quad (5)$$

where A and B are constants and $E_G$ is the semiconductor forbidden bandgap energy which is related to the wavelength cutoff $\lambda_C$ by Plank's constant h and the speed of light c($E_G=hc/\lambda_C$).

In detecting either visible or infrared images, photons pass through the semitransparent substrate or semitransparent electrodes and are absorbed in the semiconductor where the absorption process creates minority carriers which can be collected in the CTD potential well. The sensitivity of the CTD as an infrared sensor is proportional to the maximum time (maximum integration time) the well can collect signal generated charge. The signal-to-noise ratio of the infrared CTD is proportional to the square root of the maximum integration time. Unfortunately, in addition to the infrared signal generated charge, there is a much larger charge generated due to the infrared coming from viewing room temperature background. This infrared background generated charge limits the maximum integration time for signal generated charge. The relatively low maximum $E_S$ in long wavelength response semiconductors such as HgCdTe severly limits the maximum charge capacity of the well and thereby the maximum integration time, maximum signal, and maximum signal-to-noise ratio of the infrared sensitive CTD.

Figures 10A, 10B:
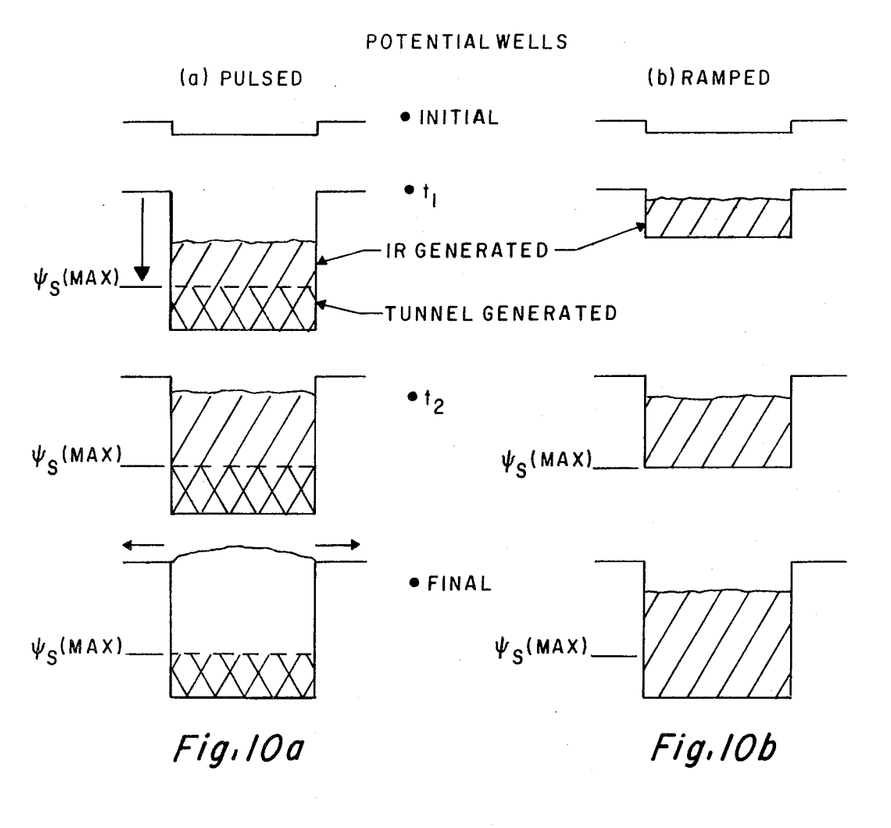
FIGS. 10a and 10b show, respectively, the filling of potential wells without ramping and with ramping over identical integration times.

FIG. 10a shows the standard mode of infrared detection in an MIS well of a CTD array in which the gate voltage is pulsed from an initial low value to a large value to create a potential well in the semiconductor. The initial $\psi_S$ created is given by the depth of the potential wells shown in FIG. 10a. FIG. 10a shows the case with the initial $\psi_S$ larger than the tunnel threshold $\psi_S$ (max) value; in this case, charge very rapidly tunnels to the well to partially fill the well to the dashed line at $\psi_S$ (max). After this initial tunnel current, the infrared generated minority carriers slowly begin to fill the well as shown for times $t_1$ and $t_2$. Finally, the potential well overfills as shown at the bottom of FIG. 10a because the tunnel current has reduced the charge capacity available for the storage of infrared generated minority carriers. Signal charge cannot be collected for a time longer than that for which the tunnel and background generated carriers completely fill the well.

When the MIS gate voltage is ramped in the presence of an infrared background which creates a minority carrier current density $J_0$ amps/cm$^2$, $Q_{INV}$ increases simultaneously with the increase in V. Equation 3 shows that if the rate of increase of $Q_{INV}/C_{INS}$ just balances the rate dV/dt of increase of V, then the surface potential $\psi_S$ will not change. Since $J_0=-dQ_{INV}/dt$, the requirement for a constant $\psi_S$ during the ramp of a partially filled well is $$dV/dt=J_0/C_{INS} \quad (6)$$

If dV/dt is slightly larger than $J_0/C_{INS}$, the surface potential will slowly increase. If (dV/dt$-J_0/C_{INS}$) is small enough, it will take an extremely long time for $\psi_S$ to reach $\psi_S$ (max). Thus, the large charge generation rate due to infrared background which was a problem for the pulsed mode of FIG. 10a can be used to suppress the creation of tunnel generated charge when a gate voltage ramp is used.

FIG. 10b shows the growth of surface potential and stored charge for the ramped MIS over the same time as those shown in FIG. 10a. The same MIS structure was used for determining the growth of surface potential shown in FIGS. 10a and 10b. In FIG. 10b, the well does not overfill because no tunnel generated charge has appeared in the well. Large increases in maximum integration time can be obtained for closely balanced ramps. A maximum ramped integration time 17-times longer than that obtained for a pulsed MIS has been observed for a HgCdTe MIS with a 9.4 m long wavelength cutoff in a 20° field-of-view for ambient radiation.

The desired ramp effect on $\psi_S$ may be improved through device design by utilizing an MIS electrode which has a small opaque region, and which has an inversion threshold slightly smaller than that for the larger area transparent region. In this design, the first effect of the ramp is to create a small empty well under the opaque electrode which is insensitive to infrared. When the gate voltage becomes larger than inversion threshold for the large area transparent gate region of the MIS, the infrared sensitive potential well starts out partially empty due to the diversion of photogenerated carriers to the opaque portion of the well. The ramp rate is chosen so that the surface potential does not increase after the gate voltage is large enough to turn on both portions of the well. The difference in flatband voltages between the transparent and opaque portions of the MIS must be smaller than that difference which would cause the potential well underneath the opaque portion from reaching the tunnel threshold before the potential well underneath the transparent electrode portion turns on.

Thus, as shown in FIG. 9c, a preset pulse 122 is applied to set the output collectors 48, 50 and 52 to a reference voltage. During the preset pulse 122, the first row of detector elements 24 are turned off to dump their charges into the read line. While off, the clamp-sample-and-hold (CS&H) circuit 56, during clamping period 124, clamps the buffered output of the output collector to hold the voltage of the output collectors 48, 50, and 52. Next, while the first row of detector elements are off, an injection pulse 126 is applied to the output MIS collectors 48, 50, and 52 to collapse these wells while simultaneously the barrier gate 78 is closed so that the charges underneath the MIS collectors are injected into the substrate. Next the buffered output of output collectors 48, 50 and 52 during the period 128 are sampled by the CS&H circuit 56 and the voltage difference determined. The voltage difference represents the value of the infrared generated charge accumulated in the first row of ramped detector elements 24. If p-n junction diodes 48, 50, and 52 had been used, the output scheme shown at the bottom of FIG. 9a could have been used.

Near the end of sampling, the first row of detector elements 24 are turned on ($-V_1$) and ramping to voltage ($-V_2$) begun. During a second preset pulse 130 the output collector is set to the reference voltage, and the second row of detector elements 26 are turned off to dump the charge of the second row of the detector elements into the read line. Next during the clamping period 132, the buffered voltages of the output collectors 48, 50 and 52 are clamped by CS&H circuits 90.

Then, while the second row of detector elements 26 are off, barrier gate 78 is turned off and a second injection pulse 134 applied to the output collector 48, 50, and 52 and the buffered output, during a sampling period 136, sampled by CS&H circuit 90. The voltage difference indicates the infrared generated charge in the second row detector elements 26. During this time, the ramping of the first row of detector elements 24 continues. Near the end of the second row sampling, the second row of detector elements 26 are turned on by a voltage ($-V$) and the ramping to voltage $-V_2$ begun. The cycle is completed by a third preset pulse 138 which again sets the collector output to a reference voltage. During preset the third row of detector elements 28 are turned off to dump their charge into the read line. The output collector is clamped during clamping period 140 to receive the outputs of the third row of detectors 28.

Next, while the third row of detector elements 28 are still off an injection pulse 142 is applied to the collector electrodes 48, 50, and 52 simultaneously the barrier gate 78 is turned of to dump charges in output charge collectors 48, 50 and 52 into the substrate. The buffered outputs of the charge collectors 48, 50, and 52 are sampled during sampling period 144 by the CS&H circuit 90 and the voltage difference represents the value of the infrared energy generated charge on the third row of detector elements 28. Near the end of sampling 144 the ramping of the first row of detectors 24 is completed, and the ramping of the second row of detectors 26 continues. Then a preset pulse 146 is applied to the output collectors 48, 50, and 52 to set them at reference voltage, and the first row of detectors 24 are turned off to dump the charge therein into the read line to start a new cycle of operation. The potential wells generated during the three stages (a, b and c) are shown in FIG. 4.

Figure 6:
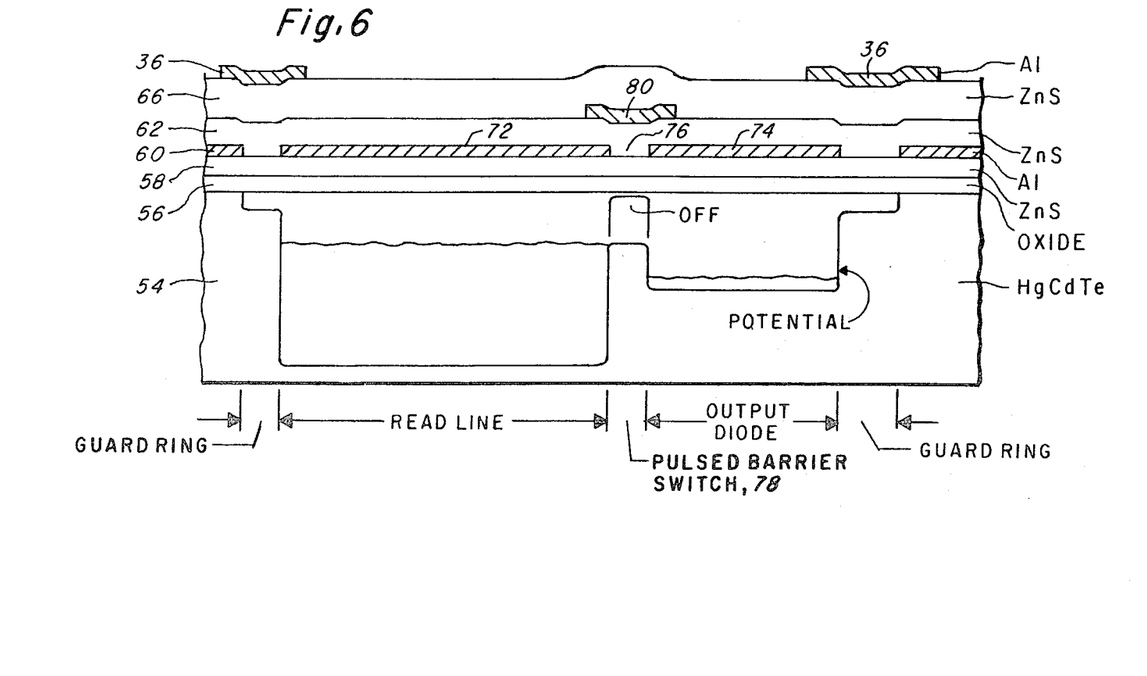

The preferred embodiment utilizes a p-n junction read line 72 of FIG. 4 to give rapid flow of the carriers from the detector wells 24, 26, and 28 to the output devices 48, 50, and 52. One purpose of the barrier well 80 of FIG. 6 is to provide a background charge in the MIS read line to shorten the response time of this read line.

Although several embodiments of this invention have been described herein, it will be apparent to a person skilled in the art that various modifications to the details of construction shown and described may be made without departing from the scope of this invention. For instance, a threshold shifting ion implant in the region of the dc transfer gates 36, 38, and 40 can be used to form the desired potential in these regions without the use of the dc transfer gates thus eliminating one set of electrodes. Also if an ion implant and/or thick insulator is used in the field stop region 60 and this implant and/or insulator are/is sufficient to keep the surface under 60 accumulated, then the field plate/channel stop MIS electrode can be eliminated.

What is claimed:
1. An infrared imaging system comprising
   (a) a lens system for focusing infrared energy emanating from a scene;
   (b) a random access imager including a horizontal scan generator, a plurality of detector elements for receiving infrared energy and storing the charges representative of the impinging infrared energy, said detector elements arranged in rows and column, each row of detector elements connected to the horizontal scan generator for sequential opera- tion and an output collector means connected to the columns of detector elements for selectively collecting the charges of the detector elements; said detector elements and output collector means comprising a substrate of semiconductor material of one type conductivity, a first level of electrodes and a first insulating layer sandwiched between the substrate and first level electrodes, said first level of electrodes for defining the detector areas and output collector means, a second layer of insulating material covering the first layer of insulator material and first level of electrodes, a second level of electrodes formed on the second insulator layer for the detector elements, a third insulator layer formed over the second insulator layer and second level electrodes, and third levels of electrodes formed on the third insulator layer, said third level of electrodes forming transfer gates selectively interconnecting the output collector to columns of detector elements, circuit means connected to the output collector means for determining the quantity of charge representative of the infrared energy impinging on the detector elements; and (c) a signal processing means for processing the electrical energy representative of the infrared energy emanating from a scene into video signals.

2. An infrared imaging system comprising:
(a) a lens system for focusing infrared energy emanating from a scene;
(b) a random access imager including a horizontal scan generator, a plurality of detector elements for receiving infrared energy and storing charges representative of the impinging infrared energy, said detector elements arranged in rows and columns, each row of detector elements connected to the horizontal scan generator for sequential operation, and an output collector means connected to the columns of detector elements for selectively collecting the charges of the detector elements; said random access imager and output collector means comprising a substrate of semiconductor material of first type conductivity, regions of second type conductivity forming in said substrate P-N junction regions defining output collector means, a first layer of insulating material covering the substrate, a first level of electrodes formed on the first insulating area forming a field plate channel stop, a second insulating layer covering the first level electrodes and first insulating layer, electrodes transparent to the infrared energy formed on the second insulating layer, said electrodes defining the MIS detector element areas, leads formed on the second insulating layer selectively connecting the transparent electrodes, a third insulation layer formed over the transparent electrode leads and second insulating layer, and transfer gate electrodes formed on the third insulation layer over the P-N regions for selectively interconnecting the detector elements to the output collector means; circuit means connected to the output collector means for determining the quantity of charge representative of the infrared energy impinging on the detector elements; and (c) a signal processing means for processing the electrical energy representative of the infrared energy emanating from a scene into video signals.

3. An infrared imaging system according to either of claims 1 and 2 further including a ramp waveform generator having inputs connected to the scan generator and outputs connected to rows of the detector elements for providing voltage amplitudes which increase continuously with time to the detector elements.

4. An infrared imaging system according to either of claims 1 and 2 wherein the output collector means includes a read line and a charge collector.

5. An infrared imaging system according to claim 4 wherein the read line and charge collector are in a spaced relationship and the output collector means further includes a barrier gate for selectively connecting the read line and charge collector.

6. An infrared imaging system according to claim 5 wherein the read line is an MIS structure and the charge collector is a p-n junction.

7. An infrared imaging system according to claim 5 wherein the read line is a p-n junction and the charge collector is an MIS structure.

8. An infrared imaging system according to claim 5 wherein the read line and the charge collector are MIS structures.

9. An infrared imaging system according to claim 5 wherein the read line and charge collector are p-n junctions.

10. An infrared imaging system according to claim 5 wherein the barrier gate is an MIS structure.

* * * * *